United States Patent

Fahy et al.

Patent Number: 5,595,801
Date of Patent: Jan. 21, 1997

[54] LAMINATED SHIELDING MATERIAL AND METHOD FOR SHIELDING AN ENCLOSURE THEREWITH

[75] Inventors: Lawrence J. Fahy, Warwick; Peter J. Angelini, Central Valley; David A. Diermeier, Warwick; John Marconi, Middletown, all of N.Y.

[73] Assignee: International Paper Company, Purchase, N.Y.

[21] Appl. No.: 116,455

[22] Filed: Sep. 3, 1993

(Under 37 CFR 1.47)

Related U.S. Application Data

[63] Continuation-in-part of Ser. No. 737,626, Jul. 30, 1991, abandoned.

[51] Int. Cl.⁶ .............................. B32B 7/12; B32B 31/12
[52] U.S. Cl. ................ 428/40.1; 156/272.2; 156/275.3; 156/304.1; 174/35 R; 174/35 MS; 174/36; 361/816; 428/284; 428/285; 428/361; 428/375; 428/379; 428/388; 428/389; 428/394; 428/395; 428/902; 428/922
[58] Field of Search .......................... 428/40, 285, 284, 428/902, 922, 361, 375, 379, 388, 389, 394, 395; 174/35 MS, 35 R, 36; 361/424; 156/272.2, 275.3, 304.1

[56] References Cited

U.S. PATENT DOCUMENTS

| | | |
|---|---|---|
| 2,498,493 | 2/1950 | Hickernell .......................... 174/35 MS |
| 2,702,580 | 2/1955 | Bateman ..................................... 154/37 |
| 2,808,352 | 10/1957 | Coleman et al. ......................... 117/227 |
| 2,961,365 | 11/1960 | Sroog ........................................ 154/139 |
| 2,964,587 | 12/1960 | Minot ..................................... 174/117 |
| 3,112,221 | 11/1963 | Price ........................................ 117/217 |
| 3,431,348 | 3/1969 | Nellis et al. ................................ 174/35 |
| 3,497,383 | 2/1970 | Olyphant, Jr. et al. .................. 117/212 |
| 3,512,946 | 5/1970 | Hutkin ........................................ 29/195 |
| 3,770,570 | 11/1973 | Swearingen et al. ..................... 161/216 |
| 4,031,281 | 6/1977 | Keeling ....................................... 428/90 |
| 4,045,607 | 8/1977 | Swearingen et al. ..................... 428/200 |
| 4,435,465 | 3/1984 | Ebneth et al. ............................. 428/195 |
| 4,471,015 | 9/1984 | Ebneth et al. ............................. 428/195 |
| 4,544,571 | 10/1985 | Miller ........................................... 427/40 |
| 4,557,965 | 12/1985 | Karlsson ................................... 428/196 |
| 4,596,897 | 6/1986 | Gruhn ........................................ 174/36 |
| 4,606,966 | 8/1986 | Karlsson ................................... 428/196 |
| 4,622,192 | 11/1986 | Ma ............................................. 428/285 |
| 4,647,714 | 3/1987 | Goto ............................................ 174/36 |
| 4,649,014 | 3/1987 | Tochikawa ................................. 264/555 |
| 4,678,699 | 7/1987 | Kritchevsky et al. .................. 428/175 |
| 4,684,762 | 8/1987 | Gladfelter .................................. 174/36 |
| 4,686,127 | 8/1987 | Burns et al. ................................ 428/40 |
| 4,686,141 | 8/1987 | Burns et al. .............................. 428/344 |
| 4,689,098 | 8/1987 | Gaughan .................................. 156/622 |
| 4,728,395 | 3/1988 | Boyd, Jr. ................................... 162/138 |
| 4,731,500 | 3/1988 | Otsuka ........................................ 174/36 |
| 4,737,598 | 4/1988 | O'Connor .................................. 174/36 |
| 4,749,625 | 6/1988 | Obayashi et al. ........................ 428/624 |
| 4,750,957 | 6/1988 | Gustafson ........................... 174/35 MS |
| 4,759,986 | 7/1988 | Marikar et al. .......................... 428/389 |

(List continued on next page.)

FOREIGN PATENT DOCUMENTS

| | | |
|---|---|---|
| 292699 | 11/1988 | Japan . |
| 165200 | 6/1989 | Japan . |

*Primary Examiner*—Nasser Ahmad
*Attorney, Agent, or Firm*—Ostrager, Chong & Flaherty

[57] ABSTRACT

A shielding system for an enclosure wherein strips of shielding material including a layer of metal, for example, metal foil or gauge metal, are placed on the walls of the enclosure in an overlapping or abutting relationship, with shielding tape between the overlapped portions or overlying the butted seam. The shielding tape preferably consists of an electrically conductive nonwoven mat of entangled fibers which is laminated on one side to metal foil and which is bonded on the other side to the metal substrates using nonconductive adhesive. The entangled fibers penetrate the nonconductive adhesive and contact the surface of the metal substrate to provide an electrical continuity that seals the seam against leakage of electromagnetic radiation.

20 Claims, 2 Drawing Sheets

U.S. PATENT DOCUMENTS

| | | | |
|---|---|---|---|
| 4,770,916 | 9/1988 | Leukel et al. | 428/95 |
| 4,774,148 | 9/1988 | Goto | 428/607 |
| 4,781,971 | 11/1988 | Marikar et al. | 428/212 |
| 4,784,899 | 11/1988 | Ono et al. | 428/236 |
| 4,794,206 | 12/1988 | Weinstein | 174/35 |
| 4,826,718 | 5/1989 | Unsworth | 428/175 |
| 4,830,901 | 5/1989 | Merry | 428/206 |
| 4,965,408 | 10/1990 | Chapman et al. | 174/35 MS |
| 5,117,065 | 5/1992 | Savage et al. | 174/35 MS |

LAMINATED SHIELDING MATERIAL AND METHOD FOR SHIELDING AN ENCLOSURE THEREWITH

This application is a continuation-in-part application of U.S. patent application Ser. No. 07/737,626, filed on Jul. 30, 1991, now abandoned.

FIELD OF THE INVENTION

This invention generally relates to materials and methods for shielding electronic circuitry from either a transmitter or receiver of electromagnetic energy. More specifically, the invention relates to a laminated material comprising a layer of nonwoven fabric material for protecting electronic circuitry from the adverse effects of external electrostatic discharge (ESD) and electromagnetic interference (EMI) and for preventing electronic espionage.

BACKGROUND OF THE INVENTION

In matrix form, the shielding effectiveness of a conductive material depends on the amount of material used versus its aspect ratio. A material's aspect ratio is the length-to-diameter ratio of the individual conductive particles. For example, spherical conductive particles like carbon black (with an aspect ratio of unity) must be added at high levels to make plastic parts conductive. Because fibers have a higher aspect ratio, the same level of conductivity can be achieved in the plastic part using a much lower level of the conductive material in fiber form (for example, carbon fibers). This is because at the same loading level in a plastic part, fibers have a greater probability of making contact with each other than do spherical particles. With conductive fibers, this higher contact level provides more paths for an electric current to follow throughout the plastic part. Therefore, the plastic part is more conductive with the conductive material in fiber form as opposed to particle form.

Furthermore, in the context of mats that contain long conductive fibers (with aspect ratios as high as 4000) the same principle applies. The same amount of long conductive fibers in a planar configuration will be more effective at providing conductivity than they would be in a three-dimensional configuration. This is because there will be more fiber-to-fiber contact in a two-dimensional array than in a three-dimensional array for equal numbers of fibers. Therefore, plastic parts incorporating a given amount of long conductive fiber in mat form will have more conductivity than they would if the fibers were incorporated as staple, for example, loose fiber.

This analysis also applies to the planar configuration of the conductive fibers in the mat. A random distribution of conductive fibers will provide more conductivity than a directional distribution of conductive fibers because there is more fiber-to-fiber contact. Wet-laid nonwovens technology provides random fiber distribution. It follows that nonwoven mats made from wet-laid conductive fibers will have greater conductivity, everything else being equal, than woven mats with directional conductive fibers. This greater conductivity increases the shielding effectiveness of conductive nonwovens.

Thus, the wet-laid nonwovens process is the most convenient, efficient and economical way to exploit conductive material properties. Dispersion technology is used to make a nonwoven mat having long conductive fibers. By blending conductive fibers with nonconductive fibers (like polyester or glass), the conductivity of the mat can be tailored to specific market requirements. The fiber blending capabilities of the wet-laid process allow nonwoven mats to be designed with conductive fiber levels from 0.25% to 100% and basis weight from 7 to 240 g/m$^2$. Using high-aspect-ratio conductive fiber in a nonwoven mat provides a continuous conductive matrix, even at the lowest basis weight and conductive fiber level.

Thus, a wet-laid nonwoven fiber mat having high-aspect-ratio conductive fibers, such as carbon, nickel-coated graphite (NCG) and aluminized glass, is an effective, convenient and economical way to provide ESD and EMI protection. However, such mats are disadvantageous in that they do not perform well against radiation in the low to middle megahertz frequency ranges, i.e., 10 to 200 MHz.

For example, conductive fibers consisting of carbon or nonconductive fibers coated with copper or aluminum primarily shield the electrical field and plane wave component of electromagnetic radiation. A conductive fiber content of 3–100% in a nonwoven mat also provides ESD protection. The balance of the fiber content can be polyester (e.g., polyethylene terephthalate (PET)), polypropylene, glass or other nonconductive fibers. Such mats can be incorporated in a variety of packaging materials, like plastic bags, envelopes and rigid boxes. Alternatively, conductive fibers consisting of stainless steel or nonconductive fibers coated with nickel or iron provide magnetic field attenuation.

Nonwoven mats containing 33–100% conductive fibers provide EMI shielding properties. These mats can be molded into plastic business machine housing and automobile hoods. For example, in automotive applications, a 17 g/m$^2$, 100% NCG mat provides an average of 60 dB shielding attenuation in the 500 kHz to 120 MHz frequency range. More demanding shielding applications like architectural shielding and high-performance electronic housings require heavier weight NCG mats to provide adequate protection over a broader frequency range.

A shielded enclosure, whether it be a room or a cabinet, is only as effective as its weakest point. Although a planar material might be an excellent shielding material, it will only be one component of many in an installed system. For example, consider a room that is to be shielded. Since people must have access into and out of the room and will need environmental conditioning in the form of fresh air, heating and cooling, lighting, etc., many penetrations or openings cut into the walls will be necessary. Each opening must be shielded to prevent the entry or exit of electromagnetic radiation. Likewise, the planar conductive material used to shield the walls, floor and ceiling will need to be mated to each other as well as to the devices used to shield the openings. Hereinafter, the term "seaming" will be used to refer to the mating of sheets of the planar conductive material to each other and to the peripheral shielding devices.

In order to prevent the intrusion or escape of electromagnetic waves, enclosures are required which are electrically continuous and free of electrically transparent openings. Electromagnetic waves travel along the surface of the shielding material. Should the wave find a hole or gap having a dimension greater than some critical value, the wave can pass through and thereby radiate into or leak out of the protected area. The leakage of electromagnetic radiation through any opening depends on two factors: the largest dimension D of the opening and the wavelength w of the radiation. When w<2D, the radiation will pass through the opening freely. When this happens, the room is said to leak and the shielding will be ineffective in protecting the equipment in the room against EMI. Any frequency for which w>2D will be unable to penetrate the opening.

This principle applies to the nonwoven fabric as well as to seams. If the dimension of the interfiber spaces of the nonwoven mat is D, then all wavelengths greater than 2 D will be cut off. Similarly, any opening in the seam must have a dimension less than one-half of the shortest wavelength to be shielded against.

One of the most difficult problems with conventional planar shielding media such as metal foil, wire mesh and sheet (gauge) metal has been how to effect EM-radiation-tight seams that will not open when the structure is stressed. A good seaming technique is to weld or solder all seams, but this is expensive, time-consuming and not always practical. Gasketing and compression bolting is often used, but these can loosen with time and therefore must be accessible to enable periodic retorquing. Furthermore, if the bolts are overtorqued, bulging of the panel or sheet can arise, resulting in a gap of sufficient size to enable passage of EM waves therethrough. Unless painstaking attention is paid to seaming construction, the shielding effectiveness of such materials degrades at higher frequencies. Special copper seaming tapes with pressure-sensitive adhesive are available but are prone to releasing off of the substrate wall over time.

Foils have traditionally been used to tape across seams. Because foils are impermeable, the adhesive used to adhere the tape must be conductive or it will form an insulating layer leading to electrical discontinuity between conductive surfaces to be joined. Conductive adhesive is expensive and to eliminate their use with foils, a dimple pattern is embossed into the foil. When carefully applied with appropriate pressure the dimple pushes through the adhesive to provide direct contact with the conductive surfaces to be seamed. These foils are difficult to work with and must be installed carefully to avoid wrinkles or gaps that could introduce electrically discontinuous areas and, therefore, EM radiation leakage.

Shielding tapes based solely on metal foil are further disadvantageous because of the poor mechanical performance of foil. Metal foil is susceptible to folding and creasing, which creates a waveguide opportunity for electromagnetic radiation.

In contrast, conductive nonwoven fabric material is easily seamed, so that degradation of the shielding effectiveness for higher-frequency radiation does not occur. However, such nonwoven systems are not entirely satisfactory in that conductive nonwoven materials do not perform well in the middle frequency ranges.

BRIEF SUMMARY OF THE INVENTION

The present invention provides a method for shielding an enclosure in which the disadvantages of prior art shielding systems are overcome. The shielding technique of the invention is effective against radiation in both the middle and high frequency ranges.

It has been discovered that conductive, highly porous, fibrous fabrics or mats can be conveniently bonded to a variety of surfaces with commonly obtained and inexpensive nonconductive adhesives. It has also been found that if these fabrics or mats overlap conductive surfaces, electrical continuity is maintained. For example, to prevent electromagnetic radiation from leaking through a seam where two conductive panels come together, it is required that the seam be bridged by a conductive medium that maintains electrical continuity from panel to panel across the seam without any gaps. If the seam were left unsealed or if a gap were still present even after seaming, the incident EM radiation would travel across the panel face and, where it reached an electrical discontinuity, would radiate or leak through it.

It has been found that a conductive fibrous structure such as a nonwoven textile can serve as a less expensive, more easily installed seaming tape. The structure is composed of thousands of individual conductive fibers and, in a non-woven, these fibers are randomly both orientated and packed. This produces a very compressible structure with large void volume. When adhesively applied, a large number of surface fibers push through the adhesive and contact the conductive substrates to be seamed. Because of the void volume or porous nature of the nonwoven substrate, the adhesive that is being pushed aside by the surface fibers has a place to readily accommodate it, thus avoiding the need for a conductive adhesive because no insulating layer, or film, can form.

The shielding technique of the invention utilizes shielding material having a layer of conductive nonwoven fabric with a fiber composition adjusted to meet the specific shielding requirements of the user. By enabling the shielding system to be tailored to the needs of the user, the user need not pay for more shielding capability than is required, thereby avoiding waste and reducing expenses.

Alternatively, a foil-backed tape comprising conductive nonwoven fabric laminated to foil can be used to assure high attenuation at the middle (weak) frequencies. Also when magnetic shielding is required, a foil/nonwoven laminate must be used.

The method for shielding an enclosure of the invention enables laminated shielding material to be easily seamed and installed using shielding tape. This shielding technique utilizes easily installed panels or strips comprising at least a nonwoven fabric material laminated to gauge metal or metal foil. Adjacent panels or strips are abutted or overlapped with seaming provided by the conductive nonwoven fabric material of shielding tape. Alternatively, where the shielding material is nonwoven material laminated to a metal substrate, adjacent strips or panels can be overlapped so that the conductive nonwoven fabric material of one of the strips or panels serves to seal the lap seam. In both cases electrically conductive nonwoven fabric used in conjunction with nonconductive adhesive act to seal the lap or butt seam against leakage of radiation.

According to a first installation technique, adjacent metal substrates are butt seamed and leakage of EM radiation is prevented by the application of shielding tape which overlies the seams. The shielding tape is preferably a conductive nonwoven fabric which is adhered to the metal substrate by nonconductive adhesive.

In a second installation technique applicable to flexible strips only, adjacent metal substrates are lap seamed to prevent the leakage of EM radiation associated with butt seams. The lap seam is sealed by applying shielding tape comprising a conductive nonwoven mat between the overlapping portions, such shielding tape having nonconductive adhesive applied on both sides.

A third preferred shielding system for an enclosure is provided wherein strips of wall covering comprising conductive nonwoven fabric material laminated to metal foil are applied with overlapped seams on the walls of the enclosure. At the lap seam, the nonwoven layer of one strip opposes the metal foil of the other strip. A layer of nonconductive adhesive is applied between overlapping edges, which adhesive penetrates the nonwoven layer to allow the fibers thereof to contact the opposing metal foil.

In all of these embodiments, the electrically conductive nonwoven mat comprises either entangled electrically conductive fibers or entangled electrically nonconductive fibers which have been coated or plated with electrically conductive material.

DETAILED DESCRIPTION OF THE PREFERRED EMBODIMENTS

Figure 1:
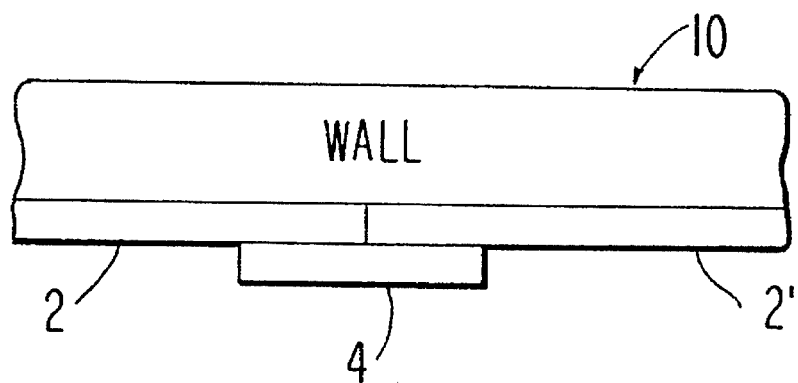
FIGS. 1 and 2 are diagrams generally depicting the seaming technique in accordance with a first preferred embodiment of the invention using nonwoven tape.

Hereinafter, the term "conductive nonwoven mat" will refer to any nonwoven mat having conductive fibers in an amount sufficient to provide either or both ESD and EMI protection when arranged between a transmitter and a receiver of EM radiation or any nonconductive nonwoven mat which has been plated with metal.

The preferred embodiments disclosed below have the common feature that an electrically conductive, highly porous, fibrous fabric or mat is bonded to an electrically conductive surface with nonconductive adhesives. When such fabrics or mats overlap conductive surfaces, electrical continuity is maintained.

In accordance with some of the preferred embodiments, seaming tape comprising a conductive nonwoven fabric is used to seal the seam between abutting or overlapped substrates. Alternatively, one substrate can overlap an adjacent substrate with the conductive nonwoven fabric of the former opposing the gauge metal or metal foil of the latter without seaming tape therebetween. Such conductive nonwoven fabric is composed of thousands of individual conductive fibers which are randomly orientated and randomly packed. This produces a very compressible structure with large void volume. When applied with nonconductive adhesive, a large number of surface fibers push through the adhesive and contact the conductive substrate or substrates to be seamed. Because of the void volume or porous nature of the nonwoven substrate, the adhesive that is being pushed aside by the surface fibers has a place to readily accommodate it, thus avoiding the need for a conductive adhesive because no insulating layer, or film, can form.

It has been found that a heavy-duty vinyl adhesive, such as Golden Harvest® G-50, (commercially available from Decorator Products Incorporated, Shawnee Mision, Kans.), is ideal. It is inexpensive and readily purchased at building supply stores. Another advantage is that the adhesive is applied during installation, so the conductive seaming tape can be stored/inventoried without concern over the life of preapplied pressure-sensitive adhesives. It has been found that preapplied pressure-sensitive adhesive will also work.

The strength of the adhesive bond has been found to be strong. Surprisingly, the tape will adhere readily to sheet metal, foil, and masonry, as well as itself. The bond is so strong that the fabric will split or delaminate rather than separate from the substrate. If this is undesirable, a weaker adhesive can be employed.

The composition of the fabric can be 100% conductive fiber, of which there are many varieties. The selection of the fiber type is dependent on the final surface and volume resistivity desired. Fabrics of 100% conductive fibers are advantageous when weight is an important consideration, for example, in some component shielding. The use of 100% conductive fiber allows a lighter-weight mat to be used. The 100% conductive fiber mats are also useful where higher surface and volume conductivity are desired. These structures can be bonded by any number of commonly used techniques. The preferred technique for bonding these fibers is chemical bonding to develop good strength while maintaining bulk. The chemical binder, of which numerous types can be employed, does not coat and therefore insulate fibers, but rather coalesces at the fiber crossover points due to surface tension and capillary forces. The fibers have good electrical contact with each other while being strongly bonded to each other.

Another useful approach is to produce a substrate from inexpensive nonconductive fibers such as polyester, nylon, etc., which can then be overplated with a suitable metal by a number of different techniques.

Another useful fabric involves blending conductive fibers with nonconductive fibers. Sufficiently high mat resistivity levels can be maintained to provide very good shielding effectiveness levels. Levels of at least 25% conductive fiber are required. A 50:50 blend has been found to be advantageous. The nonconductive fibers are tougher and impart good tear strength and drapeability to the tape. This provides a tape product that is robust and withstands the rigors of installation. The drapeability and conformability are important to ensure gap foil installation. Simple brushing or rolling will provide proper surface contact in the various types of seaming configurations encountered.

Referring to FIG. 1, the first preferred embodiment of the invention comprises first and second metal substrates 2 and 2' applied by adhesive on the inner surface of a wall 10 of an enclosure with abutting edges. The adhesive is preferably of the pressure-sensitive variety, although activatable adhesives such as heat- and solvent-activated adhesives can also be used. A release paper backing may optionally be provided on the adhesive layer to prevent removal of any adhesive or the adhesion thereto of any contaminating matter. The release paper backing is peeled off just prior to adhesion of the metal substrate at the point of application. The substrates can be either metal foil or gauge metal in the form of strips or panels having straight edges. The metal foil or gauge metal preferably consists of aluminum, copper, iron or stainless steel, although other metals with shielding properties can be used. The density and caliper of the metal foil or gauge metal can be adjusted to meet the specific shielding requirements of each application.

The butted seam between adjacent metal substrates is sealed against ESD or EMI by overlying shielding tape comprises an electrically conductive nonwoven mat 4 along the entire length of the butted seam. The electrically conductive nonwoven mat comprises entangled fibers made of or coated with electrically conductive material. A layer of nonconductive adhesive is applied on one side of the tape, either during manufacture or during installation.

The electrically conductive nonwoven mat of the shielding tape may be formed by entanglement of electrically conductive fibers (optionally with a blend of nonconductive fibers) or by entanglement of electrically nonconductive fibers followed by plating or coating with electrically conductive material.

The preferred conductive fibers incorporated in the nonwoven material of the shielding tape include fibers selected from at least one of the following types: copper-plated alkali-free glass fiber, nickel-coated graphite fiber, aluminum-coated alkali-free glass fiber, polyacrylonitrile-based carbon fiber, stainless steel fiber, nickel/iron-coated glass fiber and nickel/iron-coated carbon fiber. But other conductive fibers may work just as well. The preferred nonconductive fibers incorporated in the mat may include polyethylene terephthalate, polypropylene, glass, nylon, acrylic or equivalent fiber. As discussed above, a conductive fiber content of 3–100% in a nonwoven mat provides ESD protection; and nonwoven mats containing 33–100% conductive fibers provide EMI shielding properties.

Figure 2:
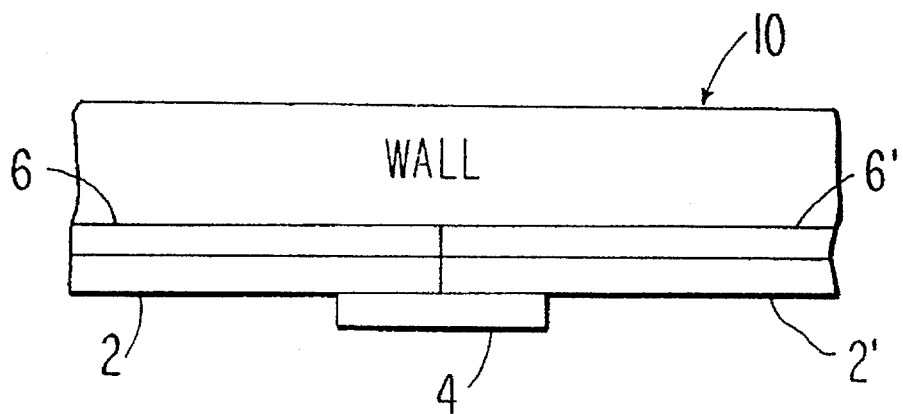

The first technique can also be used to seam laminated shielding material comprising an electrically conductive nonwoven mat (6, 6') laminated to a metal substrate (2, 2'), as depicted in FIG. 2. The metal substrate can be either metal foil or gauge metal. In this case, the strips or panels of shielding material are applied on the enclosure wall 10 with the nonwoven mat facing the wall. The shielding tape 4 is then applied onto the metal substrates such that the tape overlies and thereby seals the seam between the abutting edges of the strips or panels.

Figure 5:
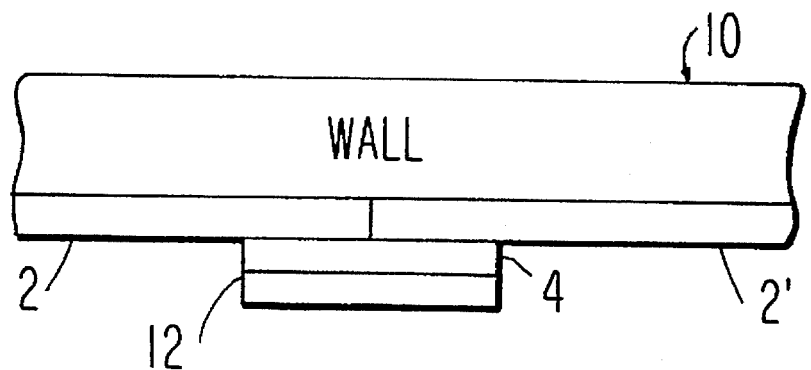
FIGS. 5 and 6 are diagrams generally depicting the seaming technique in accordance with the first preferred embodiment of the invention using a foil-backed tape.
Figure 6:
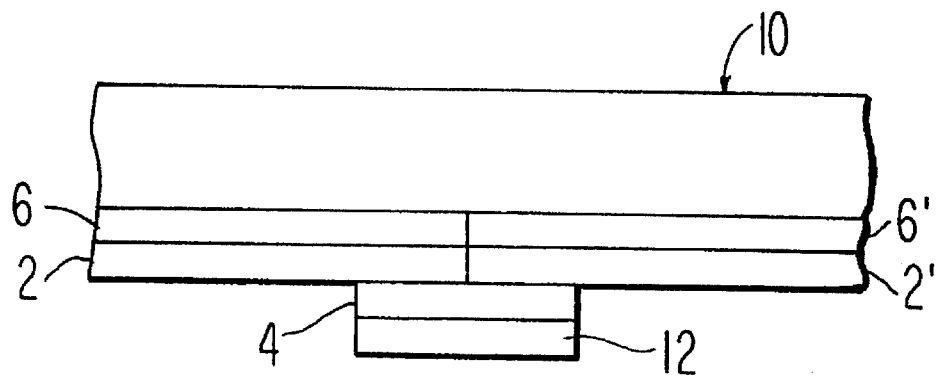

Alternatively, the shielding tape may comprise an electrically conductive nonwoven mat 4 laminated to a metal foil 12 as shown in FIGS. 5 and 6. Those components which are identical to components appearing in FIGS. 1 and 2 respectively bear the same reference numerals in FIGS. 5 and 6.

For all of the variations in accordance with the first preferred embodiment (see FIGS. 1, 2, 5 and 6), the seam should have at least a 2-inch overlap and preferably a 3-inch overlap to assure a tight (electrically) seam.

The shielding effectiveness of the system in accordance with the first preferred embodiment of the invention is demonstrated by the experimental data in Tables I and II. The data were obtained using the MIL STD 285 test method. The experimental data in Table I was obtained using a 2 ft×2 ft port and a seam having a 3-inch overlap; the experimental data in Table II was obtained using a 3 ft×3 ft×3 ft room in which all seams had a 3-inch overlap. The experimental values are given in decibels of attenuation.

TABLE I

MAGNETIC FIELD SHIELDING EFFECTIVENESS

| | Frequency (MHz) | | | |
|---|---|---|---|---|
| | 0.01 | 0.1 | 1.0 | 10 |
| Nonwoven (NW) | 2 | 5 | 13 | 30 |
| Laminate (NW/foil) | 48 | 30 | 47 | 41 |

TABLE II

SHIELDING EFFECTIVENESS

| | Frequency (MHz) | | | | | | | |
|---|---|---|---|---|---|---|---|---|
| | 1.0 | 10 | 50 | 100 | 200 | 400 | 1000 | 10,000 |
| NW | 76 | 56 | 50 | 53 | 48 | 53 | 62 | 73 |
| NW/foil | >81 | >75 | 100 | 96 | 80 | 83 | 90 | 77 |

Figure 3:
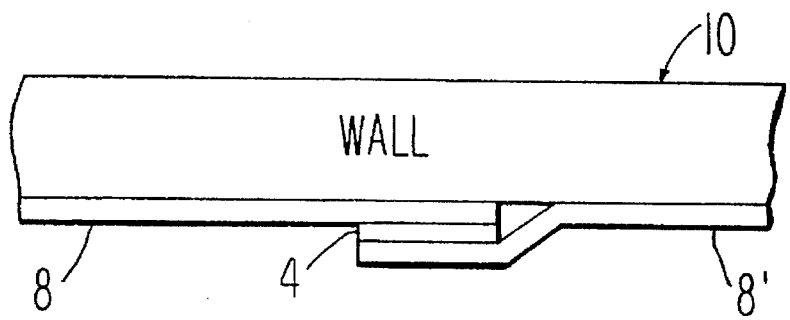
FIG. 3 is a diagram generally depicting the seaming technique in accordance with a second preferred embodiment of the invention.

In accordance with an alternative installation technique shown in FIG. 3, shielding tape 4 is placed between the overlapping edges of strips 8 and 8' of metal foil. The shielding tape 4 is a conductive nonwoven mat with nonconductive adhesive applied (either during manufacture or during installation) to both sides thereof. The fibers of shielding tape 4 contact both strips 8 and 8' to provide electrical continuity that reduces the amount of radiation leaking through the interface between overlapping edges of the strips.

Figure 4:
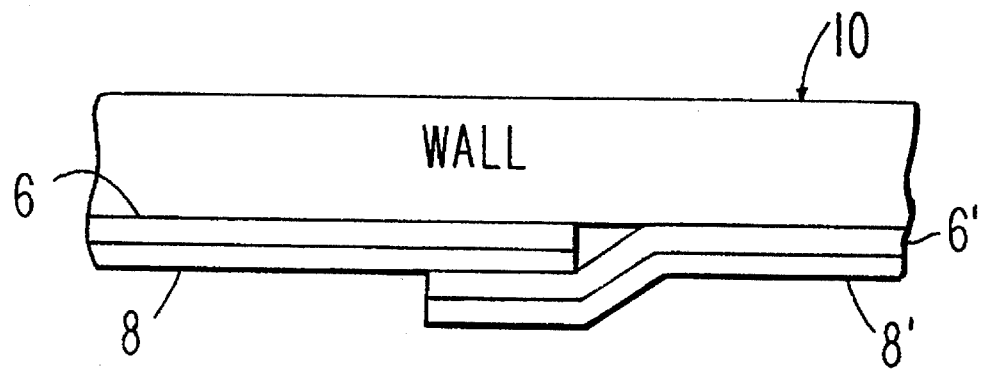
FIG. 4 is a diagram generally depicting the seaming technique in accordance with a third preferred embodiment of the invention.

In accordance with a third technique of the invention for installing strips of laminated shielding material to reduce leakage of EM radiation into an enclosure, adjacent flexible strips of laminated shielding material are applied on the enclosure surfaces with overlapping edges. FIG. 4 depicts two such strips applied on the surface of enclosure wall 10. The flexible strips respectively comprise an electrically conductive nonwoven mat (6, 6') laminated to metal foil (8, 8'). Although FIG. 4 shows the strips applied with the nonwoven mats facing the wall, alternatively the strips could be applied with the metal foil facing the wall. In either case, the electrically conductive nonwoven mat of one strip is adhered to the metal foil of the overlapping strip by a thin layer of nonconductive adhesive. The thin layer of nonconductive adhesive, when dried, results in mutual adhesion which prevents the formation of gaps between the adjacent strips, which gaps could provide windows for leakage of EM radiation. The fibers of mat 6' will penetrate through the nonconductive adhesive and contact the surface of metal foil 8, thereby shielding the lap seam against ESD and EMI.

The fiber type, fiber composition, density and caliper of the conductive nonwoven fabric material and the type of nonconductive adhesive incorporated in the shielding tape can be varied in dependence on the shielding requirements.

Although the invention has been described with reference to certain preferred embodiments, it will be appreciated that other installation techniques and shielding materials may be devised which, although not disclosed herein, are nevertheless within the scope and spirit of the invention as defined in the claims appended hereto.

We claim:

1. A system for shielding an enclosure, comprising first and second metal substrates having a seam therebetween, and means for sealing said seam to prevent leakage of electromagnetic radiation into said enclosure, said sealing means comprising a first electrically conductive nonwoven mat comprising randomly oriented and randomly packed fibers and a layer of nonconductive adhesive which penetrates said first nonwoven mat when not yet dried and which bonds said first nonwoven mat to said first metal substrate when dried, said penetration of said nonconductive adhesive allowing at least some of said fibers to contact the surface of said first and second metal substrates in said bonded state.

2. The shielding system as defined in claim 1, wherein said first and second metal substrates each comprise metal foil or gauge metal.

3. The shielding system as defined in claim 1, wherein said sealing means further comprises metal foil laminated to said first nonwoven mat.

4. The shielding system as defined in claim 1, wherein said fibers are made of electrically conductive material.

5. The shielding system as defined in claim 1, wherein said fibers are made of electrically nonconductive material coated with an electrically conductive material.

6. The shielding system as defined in claim 1, wherein said seam is a butted seam and said electrically conductive nonwoven mat of said sealing means overlies said butted seam.

7. The shielding system as defined in claim 1, wherein said seam is a lap seam and said electrically conductive nonwoven mat of said sealing means is between overlapping portions of said first and second metal substrates.

8. A system for shielding an enclosure, comprising first and second flexible strips of composite shielding material adhered to a wall of said enclosure with overlapping portions of said first and second flexible strips forming a lap seam, each of said flexible strips of composite shielding material comprising a metal substrate laminated to an electrically conductive nonwoven mat of randomly oriented and randomly packed fibers, said metal substrate of said overlapping portion of said first flexible strip opposing said nonwoven mat of said overlapping portion of said second flexible strip, and further comprising a layer of nonconductive adhesive which penetrates said nonwoven mat of said overlapping portion of said second flexible strip when not yet dried and which bonds said nonwoven mat of said overlapping portion of said second flexible strip to said metal substrate of said overlapping portion of said first flexible strip when dried, said penetration of said nonconductive adhesive allowing at least some of said fibers of said nonwoven mat of said overlapping portion of said second flexible strip to contact the surface of said metal substrate of said overlapping portion of said first flexible strip in said bonded state.

9. The shielding system as defined in claim 8, wherein said first and second metal substrates each comprise metal foil.

10. The shielding system as defined in claim 8, wherein said fibers are made of electrically conductive material.

11. The shielding system as defined in claim 8, wherein said fibers are made of electrically nonconductive material coated with an electrically conductive material.

12. A method for shielding an enclosure, comprising the steps of:

applying a first sheet of shielding material comprising a metal substrate on a surface of said enclosure so that one side of said metal substrate of said first sheet is exposed;

applying a second sheet of shielding material comprising a metal substrate on said surface of said enclosure so that one side of said metal substrate of said second sheet is exposed, said first and second metal substrates being arranged to abut along respective edges thereof to form a butted seam;

overlying said butted seam along its entire length with electrically conductive nonwoven material comprising randomly oriented and randomly packed fibers;

applying a layer of undried nonconductive adhesive between said electrically conductive nonwoven material and said first and second metal substrates, said fibers of said nonwoven material penetrating said undried nonconductive adhesive and contacting the surfaces of said first and second metal substrates;

drying said nonconductive adhesive so that said electrically conductive nonwoven material is bonded to said first and second metal substrates with at least some of said fibers in contact with said surfaces thereof.

13. The method as defined in claim 12, wherein said first and second metal substrates each comprise metal foil or gauge metal.

14. The method as defined in claim 12, wherein said electrically conductive nonwoven material is laminated to metal foil.

15. The method as defined in claim 12, wherein said fibers are made of electrically conductive material.

16. The method as defined in claim 12, wherein said fibers are made of electrically nonconductive material coated with an electrically conductive material.

17. A method for shielding an enclosure, comprising the steps of:

applying first and second sheets of shielding material on a surface of said enclosure, each of said first and second sheets comprising an electrically conductive nonwoven mat of randomly oriented and randomly packed fibers laminated to a flexible layer of metal, said first and second sheets being arranged to overlap along respective edges thereof to form a lap seam with a portion of said electrically conductive nonwoven mat of said first sheet opposing a portion of said flexible layer of metal of said second sheet;

applying a layer of undried nonconductive adhesive between said electrically conductive nonwoven material of said first sheet and said flexible layer of metal of said second sheet, said fibers of said nonwoven material of said first sheet penetrating said undried nonconductive adhesive and contacting the surface of said flexible layer of metal of said second sheet; and drying said nonconductive adhesive so that said electrically conductive nonwoven material of said first sheet is bonded to said flexible layer of metal of said second sheet with at least some of said fibers in contact with said surface thereof.

18. The method as defined in claim 17, wherein said first and second flexible layers of metal each comprise metal foil.

19. The method as defined in claim 17, wherein said fibers are made of electrically conductive material.

20. The method as defined in claim 17, wherein said fibers are made of electrically nonconductive material coated with an electrically conductive material.

* * * * *

UNITED STATES PATENT AND TRADEMARK OFFICE
CERTIFICATE OF CORRECTION

PATENT NO. : 5,595,801
DATED : Jan 21, 1997
INVENTOR(S) : Fahy, et al

It is certified that error appears in the above-indentified patent and that said Letters Patent is hereby corrected as shown below:

Column 5, line 57, change "G-50" to --GH-50--;

Column 5, line 58, change "Mision" to --Mission--;

Column 10, line 3, insert --and-- after "substrates;"

Signed and Sealed this

Eighth Day of April, 1997

Attest:

BRUCE LEHMAN

Attesting Officer     Commissioner of Patents and Trademarks